United States Patent [19]

Nishimoto

[11] Patent Number: 5,457,334

[45] Date of Patent: Oct. 10, 1995

[54] SEMICONDUCTOR MEMORY DEVICE

[75] Inventor: Shozo Nishimoto, Tokyo, Japan

[73] Assignee: NEC Corporation, Tokyo, Japan

[21] Appl. No.: 194,987

[22] Filed: Feb. 14, 1994

[30] Foreign Application Priority Data

Feb. 12, 1993 [JP] Japan .................................. 5-023828

[51] Int. Cl.$^6$ .............................................. H01L 27/02
[52] U.S. Cl. ......................... 257/306; 257/309; 257/797
[58] Field of Search .................................. 257/306, 309, 257/797

[56] References Cited

U.S. PATENT DOCUMENTS 5,162,881 11/1992 Ohya ........................................ 257/309

Primary Examiner—Mark V. Prenty

[57] ABSTRACT

A semiconductor memory device having a memory cell including a transistor having, as source and drain regions, impurity-diffused regions formed selectively in the active area isolated by field insulating film formed selectively at the surface of a semiconductor substrate and a capacitor comprising a lower electrode including a bottom electrode and a cylindrical electrode. The bottom electrode is formed on an interlayer insulating film formed over the substrate and is connected to one of the impurity-diffused regions through a first hole opened in said interlayer insulating film. The cylindrical electrode is formed at the edge portion of said bottom electrode and a plurality of second holes formed in the interlayer insulating film on said field insulating film. The first hole and the second holes have substantially the same dimensions except for a depth thereof. The second holes are arranged to be a mark representing characters to assist the process control. In addition, a check element fabricated by forming the lower electrodes covering a plurality of second holes and cylindrical electrodes so that these electrodes assume a loop toothed at a certain pitch can be prevented from being broken down even if the dimensions are large.

13 Claims, 17 Drawing Sheets

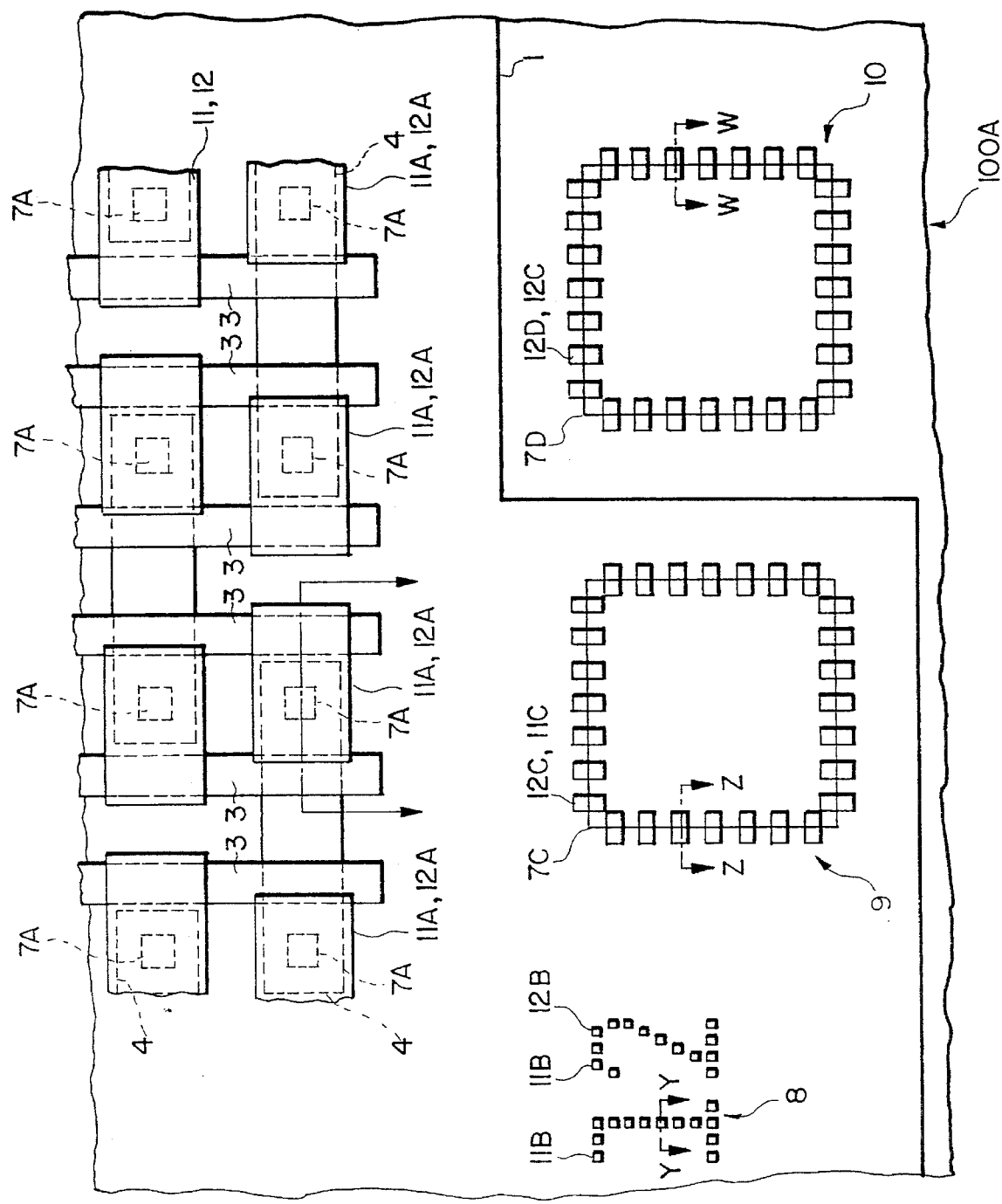

FIG. 21a PRIOR ART
FIG. 21b PRIOR ART
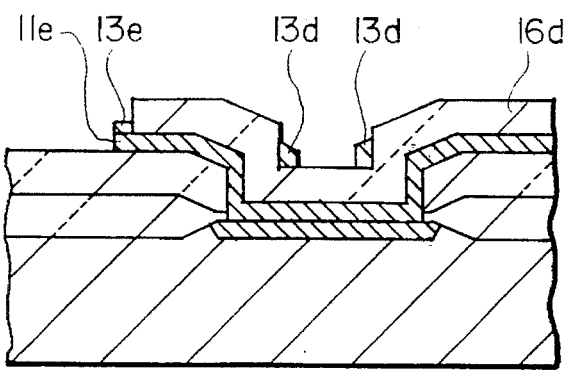
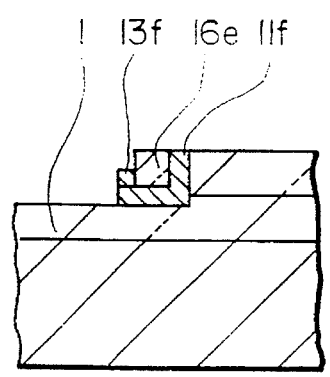
FIG. 21c PRIOR ART
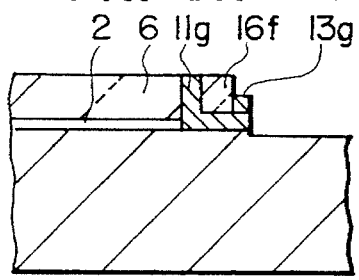
FIG. 22a PRIOR ART
FIG. 22b PRIOR ART
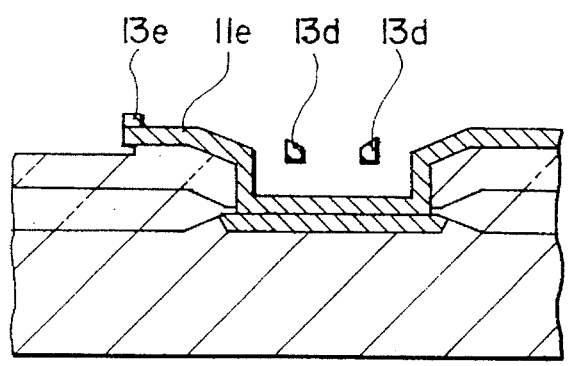
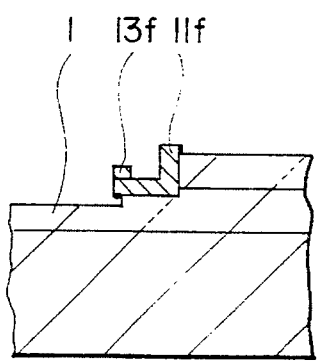
FIG. 22c PRIOR ART
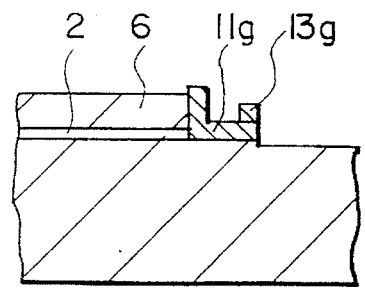

5,457,334

1
SEMICONDUCTOR MEMORY DEVICE

BACKGROUND OF THE INVENTION

1. Field of the Invention

The present invention relates to a semiconductor memory device and more particularly to a semiconductor memory device comprising memory cells having a stacked-type capacitor comprising a cylindrical electrode.

2. Description of the Related Art

The most widely employed capacitor structure for present day DRAMs is a stacked-type capacitor structure. A stacked-type capacitor having a cylindrical storage electrode for enlarging the surface area with the effects of increasing the charge per unit area of projective plane is known in the art. The manufacturing process sequence of a conventional example of such structure is described below.

Referring to FIG. 13a, on a surface of a p-type silicon substrate 5, field oxide film 1 is selectively formed to isolate an active area. In this area, gate oxide film 2 is formed, on which polysilicon film is deposited and patterned to form a word line 3 serving also as a gate electrode. Using word line 3 and the field oxide film as a mask, ion implantation is carried out to form a pair of $n^+$ regions 4-1 and 4-2 each on opposite sides, respectively, of word line 3. Interlayer insulating film 6-1 is deposited and a contact hole 7-1 leading to one $n^+$ region 4-1 is opened. After bit line 15 is formed, interlayer insulating film 6-2 is deposited and another contact hole 7-2 leading to the other $n^+$ region 4-2 is opened.

As shown in FIG. 13b, polysilicon film 11 serving as a support for a cylindrical electrode, followed by silicon dioxide film 16 serving as a core are deposited by a chemical vapor deposition (CVD) technique. As shown in FIG. 13c, after forming a core 16a of silicon dioxide film by photolithography above $n^+$ region 4-2 (alternatively, both silicon oxide film 16 and polysilicon film 11 serving as a support are patterned at this process step), polysilicon film 13 is deposited by CVD.

As shown in FIG. 13d, anisotropic etching is applied to the entire surface of the substrate to remove polysilicon film 13 and 11 except portions at just under and on the sides of core 16a. Thus, a bottom electrode 11a and cylindrical electrode 13a are formed. Next, as shown in FIG. 13e, core 16a of silicon dioxide film is removed with buffered fluoric acid, leaving a completed lower electrode comprising electrodes 11a and 13a and connected to $n^+$ region 4-2. Then, as illustrated in FIG. 13f, a silicon dioxide dielectric film 17 and an upper electrode 18 of polysilicon film are formed.

The fact should be noted with regard to this fabrication process that a formation of a core involves a cylindrical electrode of polysilicon film. Also, various mask patterns including those for the contact hole and the core for forming the memory cell are used as desired for fabrication of a semiconductor memory device, for checking finished quality, or for patterning parts of circuit elements.

The first of the required patterns is an alignment mark used in the photolithography process for the core pattern to be aligned with the contact pattern. A vernier pattern is commonly used as the alignment mark. For example, to attain finer checking under an optical microscope at about 1000-magnification, as shown in FIG. 14, holes 7a (recesses formed in the field area of a chip 100 simultaneously with contact hole 7-2) are used as a vernier pattern, and cores of 3 µm wide and 20 µm long (polysilicon films 16b and 11b 2
formed using the cores are shown) are arranged at a position offset from holes 7a 5 µm in the direction of the length. The second pattern is for evaluating, by the remaining thickness of the insulating film of silicon dioxide, whether an etch amount for forming contact hole 7-2 has been proper. This is merely a monitor contact hole 7c for detecting any under etching in the area on the substrate except for the field-oxide-film area, and another monitor hole 7b for detecting overetching on the field-oxide-film area. The size of monitor hole 7b and monitor contact hole 7c is set to about 50 µm square, taking the light beam diameter and vibration under practical circumstances into consideration so as not to make difficult the positional setting of an instrument for determining the thickness of the insulating film from the reflectance spectra. Another highly required pattern is a test element group (TEG) pattern of the stacked-type capacitor, which serves for permitting the measurement, at completion, of the thickness of the dielectric film between the stacked electrode (lower electrode) and upper electrode and the height of the cylindrical electrode, these being factors deciding the storage capacitance of the capacitor.

As illustrated in FIG. 15, this TEG includes a $n^+$ region 14 formed in the area isolated by field oxide film 1. After forming the aforesaid interlayer-insulating film 6-2 is formed in sequence contact hole 7d, bottom electrode 11b, cylindrical electrode 13b, dielectric film 17, upper electrode 18a, insulating film (not shown) and a pair of contact holes 20 one of which is connected to upper electrode 18a. Also a pair of measurement electrodes are formed at the same time as a bonding pad. Typically for the purpose of reducing the influence of noise and improving the precision of measurement, patterns having a size of about 100 µm (the size of upper electrode 18a) are used. The second is a TEG used for measurement of the sheet resistance of the capacitor electrode, which as shown in FIG. 16, includes bottom electrode 11c made of polysilicon film connected to $n^+$ region 14 through contact hole 7e and cylindrical electrode 13c are formed on the interlayer insulating film 6-2. Like the TEG shown in FIG. 15, a pair of electrode 21 connected to $n^+$ region 14 through contact holes 20 are built, which makes it possible to measure a sheet resistance value of the capacitor electrode. The capacitor electrode, if too narrow, would affect the dimensions for the photolithography, resulting in incorrect sheet resistance measurement. Therefore, a strip geometry of unaffected dimensions, typically 10 µm wide and 100 µm long is used. The third another TEG (not shown) having a structure similar to cell array and modified is used for monitoring the charge of the capacitor electrode of the memory cell and the contact resistances of the contacts.

Finally, there are subsidiary patterns for making masks and character codes for identification of masks. As shown in FIG. 17, character-shaped holes 7f and 7g representing characters 1 and 2 may be opened at the same time with the contact hole 7-1. It may be permitted to form a character-shaped hole representing a digit such as 3 at the same time with contact hole 7-2, cylindrical electrode pattern 16c and bottom electrode pattern 11d. Other various patterns may be used in future.

These patterns are in many cases formed of larger holes and cores than the memory cell area. In fact, this makes it impossible to form the patterns as desired. Assuming that they are formed as intended, how the patterns change with the fabrication steps (FIGS. 13a to 13e) of the memory cell is illustrated in FIGS. 18a, 18b and 18c through FIGS. 22a, 22b and 22c with respect to three patterns: monitor hole 7b, monitor contact hole 7c, and TEG of the capacitor. Characters a, b and c attached to the figure numbers designate the cross sections taken along lines α1-α2 of FIG. 15, β1-β2 of FIG. 14 and γ1-γ2 of FIG. 14, respectively. Reference character 6 designates the combination of interlayer insulating films 6-1 and 6-2.

As shown in FIG. 13a and FIGS. 18a, 18b and 18c, holes 7-2, 7d, 7c and 7b are formed in the memory cell area, the TEG area, the monitor contact hole area on the substrate and the monitor hole area on the field oxide film, respectively. Next, as shown in FIG. 13b and FIGS. 19a, 19b and 19c, polysilicon film 11 and silicon oxide film 16 are deposited over the entire surface. Next, as shown in FIG. 13c and FIGS. 20a, 20b and 20c, cores 16a and 16d are formed in the memory cell area and the TEG area, respectively, in this step unwanted cores 16e, 16f are formed also on sides of the monitor hole and contact hole, respectively. Polysilicon film 13 is deposited, and then, as illustrated in FIG. 13d and FIGS. 21a, 21b and 21c, cylindrical electrodes 13a, 13e, 13f and 13g are formed on the sides of cores 16a, 16d, 16e and 16f, accompanied by formation of cylindrical electrode 13d also on the inside steps of core 16d. Further in the memory-cell area) as illustrated in FIG. 23, a core 19 provided with a center recess is formed under some circumstances in contact hole 7-2, to the thickness of silicon oxide film 16 during a fabrication process. In this recess, if the etch back is insufficient, cylindrical electrode or wall 13α is formed. In addition, at the portion of the cores 16e, 13f, polysilicon films 11f and 11g are left. Next, as shown in FIG. 13e and FIGS. 22a, the cores are removed, which causes cylindrical electrodes 13d (and 13α of FIG. 23) to lose mechanical support and drift.

The conventional semiconductor memory device described above has the following drawbacks.

First: in the area where a core covering contact hole exists, such as the memory cell area or the TEG area, if a step with the wall substantially perpendicular to the inside of the contact hole is formed or a recess is formed in the core, an unnecessary cylindrical electrode (13d and 13α) is formed as a result of the etch back for forming the desired cylindrical electrode. These are not formed on the lower electrode 11 of polysilicon film, and hence, after removing the core, these elements lose support and drift out. In the memory cell area, this defect can be solved negligibly by adequately selecting dimensions of the contact hole, the fabricating process of interlayer insulating film, or the core thickness. However, such means cannot solve the problem associated with the TEG area.

Second: partial break-off happens occasionally to the cylindrical electrode after the core has been removed, as shown in FIG. 24. It is supposed that a cylindrical electrode, if made to be too thin, tall, or long in one sense, may happen to give way or come off totally under a perpendicular force applied to the surface of the cylindrical electrode due to water, vibration, or thermal stress during the fabrication process. If the capacitor electrode is large, this phenomenon can occur in the memory cell area as well, and in the TEG area.

Third: polysilicon films 11f (to which 13f is deposited) and 11g (to which 13g is deposited) are formed on the sides of holes to avoid formation of a core therein like the monitor hole or the monitor contact hole. These unwanted polysilicon films come off after the core is removed. This is probably due to the difference in thermal expansion coefficient between polysilicon film and silicon dioxide film and thermal-mechanical impact.

Fourth: when a pattern representing characters such as digits is formed with bottom electrodes and a cylindrical electrode after forming cores in an area without any hole such as a contact hole, the cores must be wet-etched away accompanied by side etching of the interlayer insulating film under the bottom electrode which then becomes unsupported and drifts out as useless substance.

As described above, the conventional semiconductor memory device offers problem associated with waste of cylindrical electrode material such as polysilicon film produced when the cylindrical electrode for the capacitor is made in the memory cell area, leading to lower yield and reliability. This problem is especially noticeable with various monitor patterns, or the like, built in one on the same chip, together with memory cells. This is problematic these patterns are indispensable to unify the quality of the semiconductor memory device and improve the yield.

BRIEF SUMMARY OF THE INVENTION

It is a major objective of the present invention to resolve the above mentioned problems and to provide a semiconductor memory device comprising memory cells having a stacked-type capacitor comprising a cylindrical electrode permitting improvement in reliability and yield.

The above objective is achieved by providing a semiconductor memory device comprising a memory cell including a transistor having, as source and drain regions, impurity-diffused regions formed selectively in the active area isolated by field insulating film formed selectively at the surface of a semiconductor substrate and a capacitor comprising a lower electrode including a bottom electrode and a cylindrical electrode. The bottom electrode is formed on a interlayer insulating film formed over the substrate and being connected to one of the impurity-diffused regions through a first hole opened in the interlayer insulating film, and the cylindrical electrode is formed at the edge portion of said bottom electrode. A plurality of second holes are formed in the interlayer insulating film on the field insulating film. The first hole and the second holes are substantially the same in dimensions except for a depth thereof.

The construction of the second holes into a mark representing characters assists in the process control. In addition, a check element fabricated by forming the lower electrodes covering a plurality of second holes and cylindrical electrodes so that these electrodes assume a loop toothed at a certain pitch can be prevented from being broken down even if the dimensions are large.

When the second hole is larger in dimensions than the first hole, sidewall is formed on the side of the second hole. A cylindrical structure which crosses over the sidewall is built to secure the sidewall.

For providing any other lower electrode in the area of the interlayer insulating film where no hole exists, the dimensions of the smallest part should be at least twice the thickness of the interlayer insulating film, and at least partially in contact with the interlayer insulating film.

In this way, the invention prevents the various structures made from the same material as the lower electrodes and/or cylindrical electrodes of the memory cell from breaking down or drifting during the fabrication process.

BRIEF DESCRIPTION OF THE DRAWINGS

The above and further objects, features and advantages of the present invention will become more apparent from the following detailed description of the embodiments taken in conjunction with the accompanying drawings, wherein:

FIG. 8 is a plan view illustrating the first embodiment of the invention in the next process step of FIG. 6;

FIG. 12a illustrates a conventional pattern and FIGS. 12b and 12c illustrate the fourth embodiments;

FIGS. 21a, 21b and 21c are cross sections illustrating the next process step of FIGS. 20a, 20b and 20c, respectively;

FIGS. 22a, 22b and 22c are cross sections illustrating the next process step of FIGS. 21a, 21b and 21c, respectively;

DETAILED DESCRIPTION OF THE PREFERRED EMBODIMENTS

Referring now to FIG. 1 through FIGS. 9a to 9d, a semiconductor memory device according to a first embodiment of the invention is described below.

Figure 1:
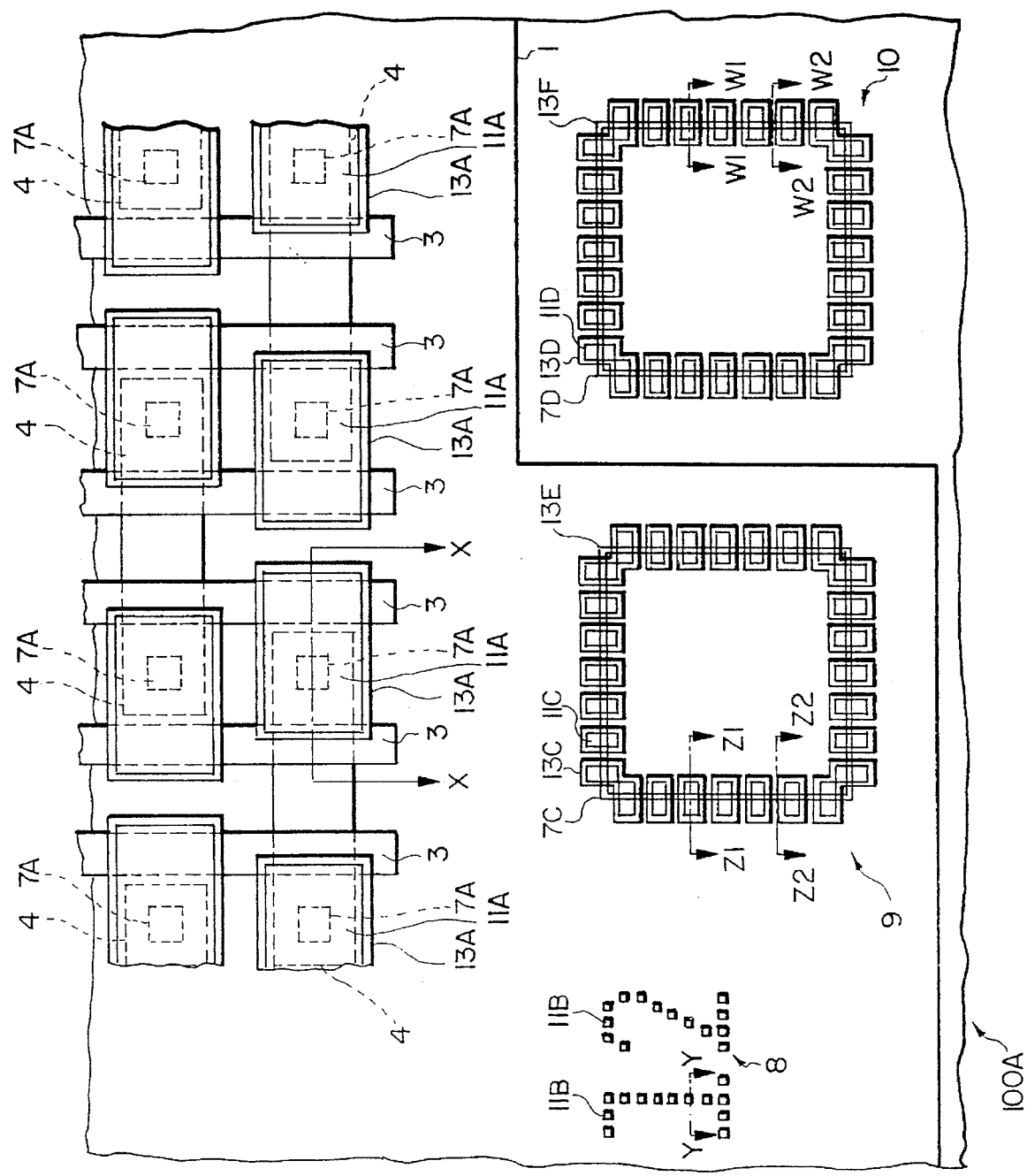
FIG. 1 is a plan view illustrating a part of a semiconductor chip of a first embodiment of the invention.

FIG. 1 is a plan view illustrating a part of a semiconductor chip 100A of a first embodiment of the present invention. In this figure, a part of a memory cell array, a mask identifying character-string 8, a monitor pattern 9 on the field insulating film, and a monitor pattern 10 on the substrate are shown, and the scale of the cell array is larger than the scales of patterns 8, 9 and 10 for convenience.

Figure 2:
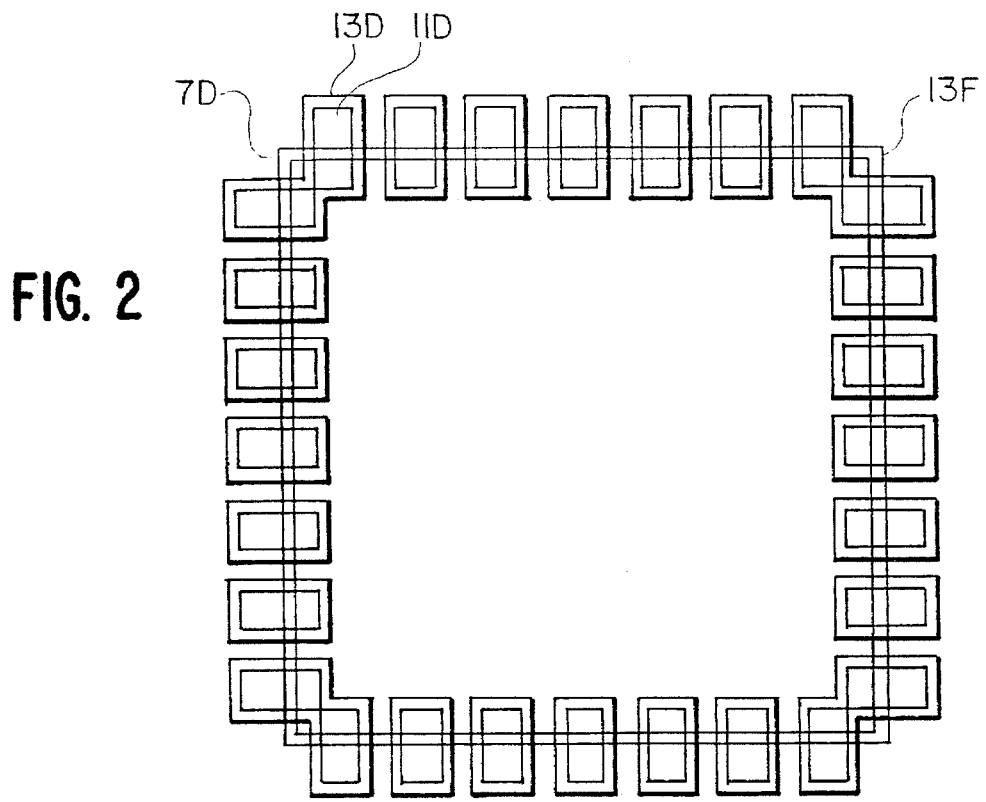
FIG. 2 is a plan view illustrating the monitor pattern 10 on the substrate of FIG. 1 drawn to an enlarged scale.

FIG. 2 is a plan view illustrating the monitor pattern 10 on the substrate of FIG. 1 drawn to an enlarged scale.

Figure 3A:
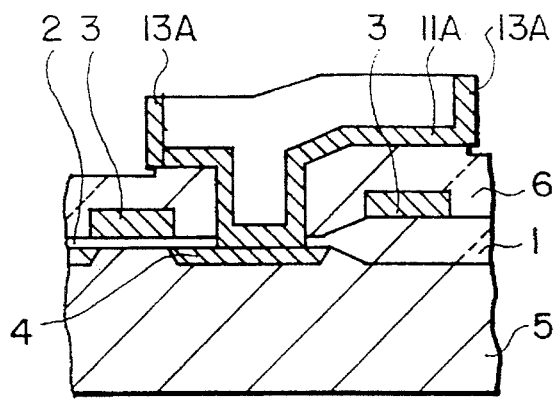
FIGS. 3a, 3b, 3c, 3d, 3e and 3f are cross sections FIG. 1 along lines X—X, Y—Y, Z1—Z1, W1—W1, W2—W2 and Z2—Z2, respectively.
Figure 3B:
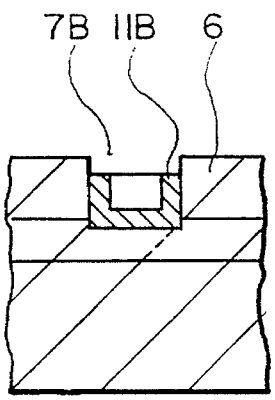
Figure 3C:
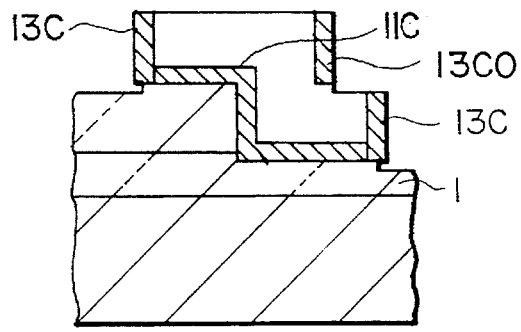
Figure 3D:
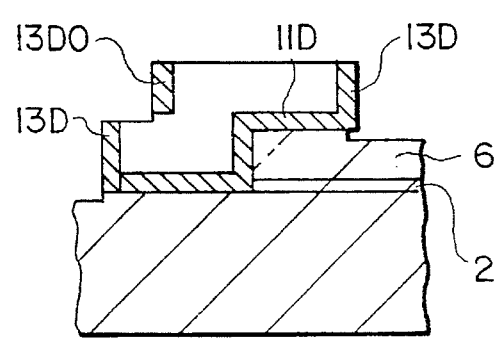
Figure 3E:
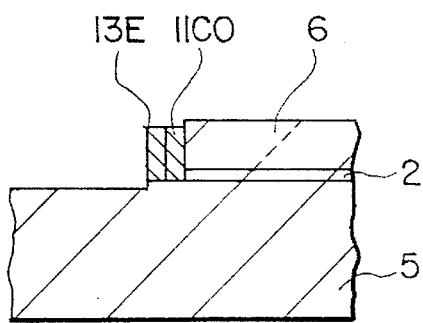
Figure 3F:
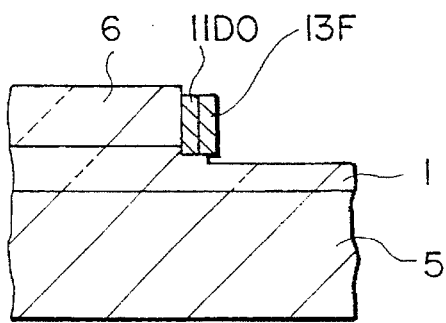

FIGS. 3a to 3d are cross sections along lines X—X, Y—Y, Z1—Z1 and W1—W1, respectively, of FIG. 1. FIGS. 3e and 3f are cross sections along lines W2—W2 and Z2—Z2, respectively, of FIG. 1.

This embodiment will be set forth in fabricating process steps below.

Figure 5A:
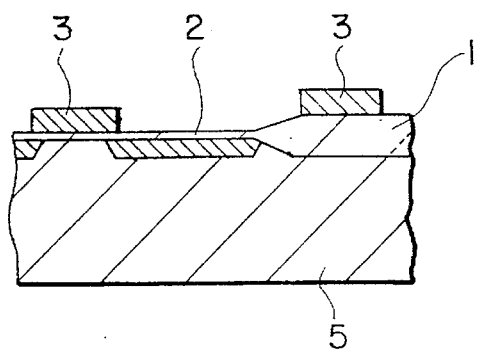
FIGS. 5a, 5b, 5c and 5d are cross sections of FIG. 5 along lines X—X, Y—Y, Z—Z and W—W, respectively.
Figure 5B:
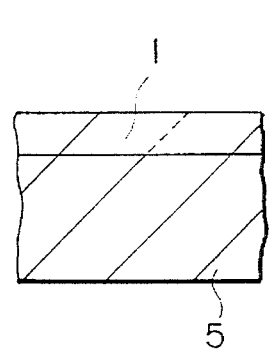
Figure 5C:
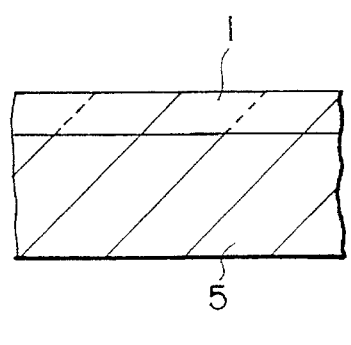
Figure 5D:
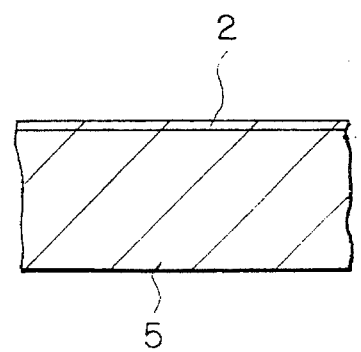
Figure 4:
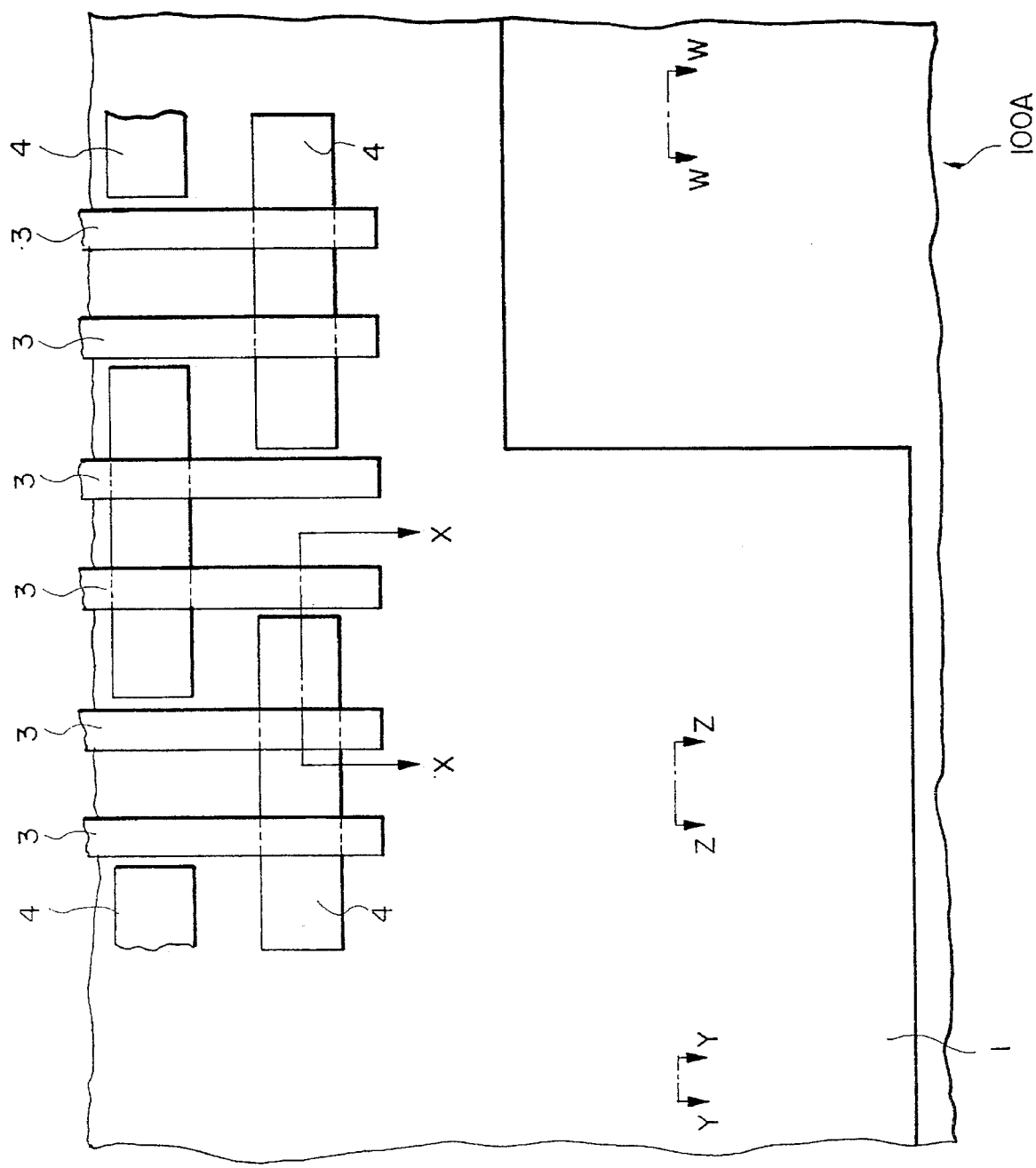
FIG. 4 is a plan view illustrating the first embodiment of the invention in an early process step.
Figure 6:
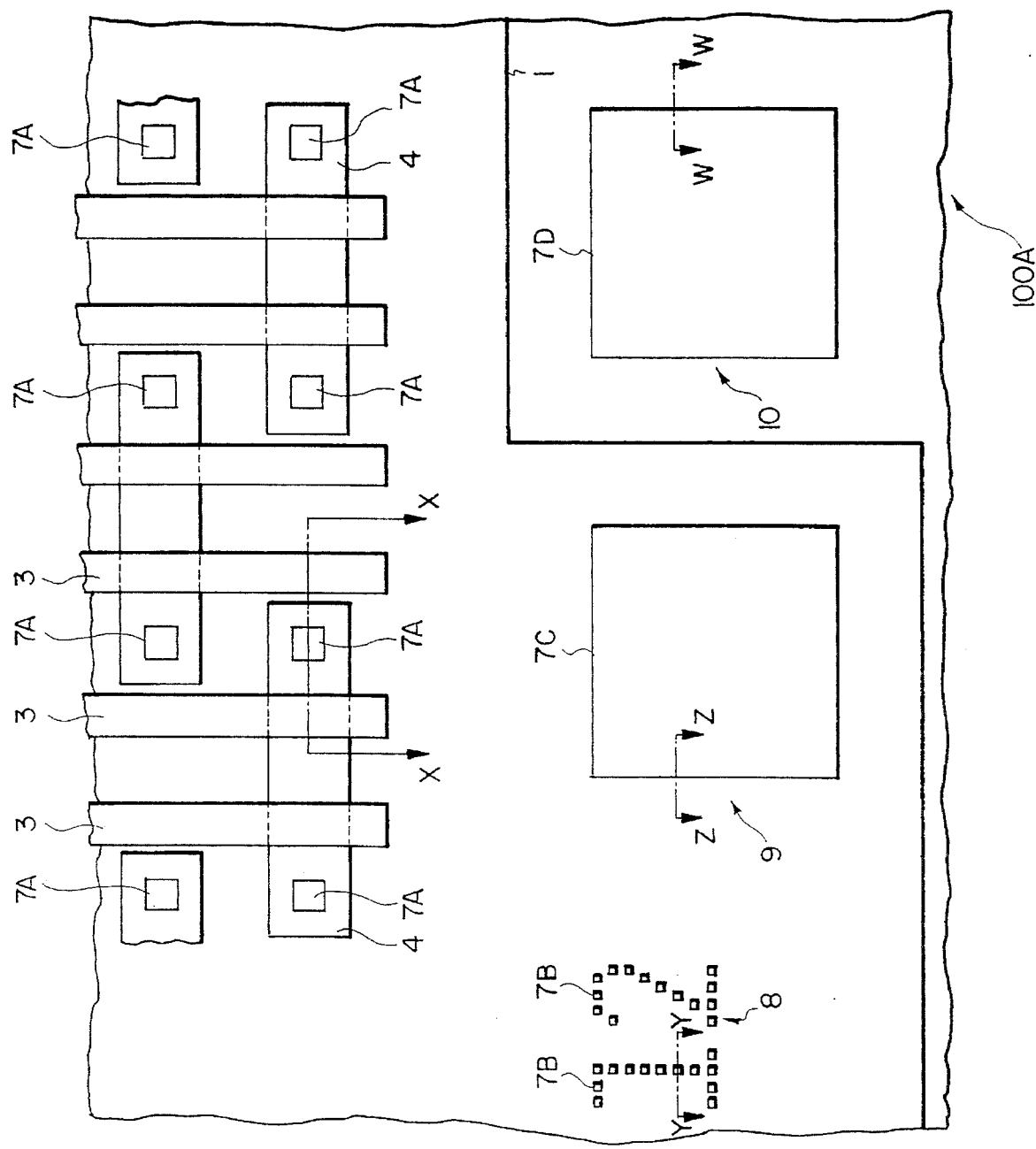
FIG. 6 is a plan view illustrating the first embodiment of the invention in the next process step of FIG. 4.
Figure 7A:
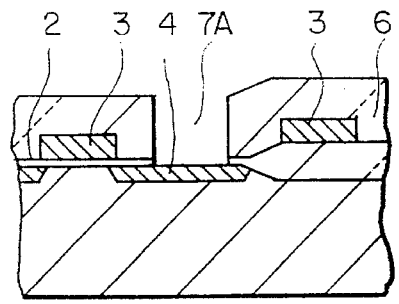
FIGS. 7a, 7b, 7c and 7d are cross sections of FIG. 6 along lines X—X, Y—Y, Z—Z and W—W, respectively.
Figure 7B:
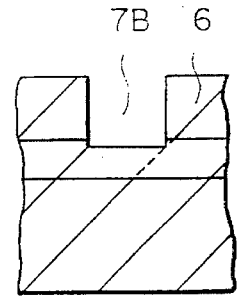
Figure 7C:
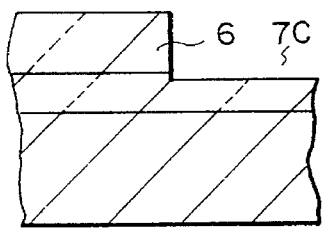
Figure 7D:
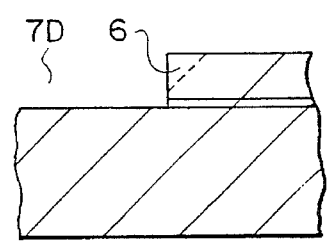
Figure 9A:
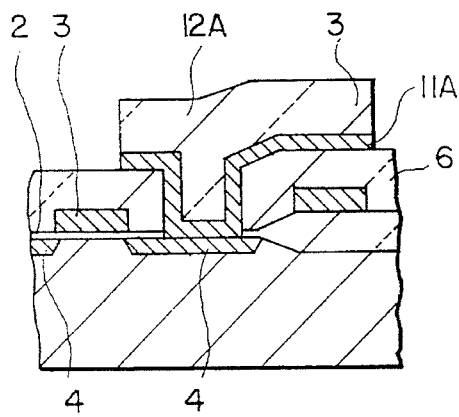
FIGS. 9a, 9b, 9c and 9d are cross sections of FIG. 8 along lines X—X, Y—Y, Z—Z and W—W, respectively.
Figure 9B:
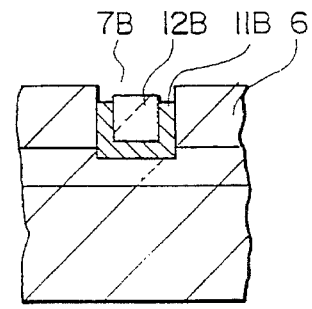
Figure 9C:
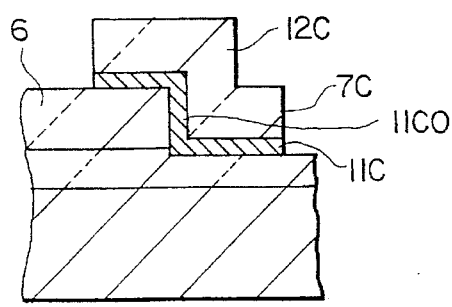
Figure 9D:
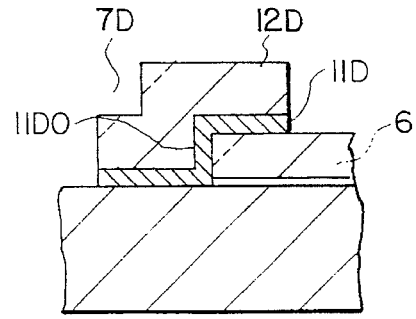

As shown in FIG. 4, FIG. 5a (cross section along line X—X of FIG. 4), FIG. 5b (cross section along line Y—Y of FIG. 4) and FIG. 5c (cross section along line W—W of FIG. 4), at a surface of a p-type silicon substrate 5, field oxide film 1 having a thickness of about 300 nm is selectively formed on the surface of the substrate to isolate an active area by means of, for example, LOCOS method. After forming a gate oxide film 2 having a thickness of about 100 nm, a word line 3 also serving a gate electrode is formed. Subsequently $n^+$ regions 4 are formed by ion implantation, and simultaneously $n^+$ region 4 (not shown in FIG. 5d) is formed also in the area on which monitor pattern 10 to be formed. As shown in FIG. 6, 7a, 7b, 7c and 7d, interlayer insulating film 6 (corresponding to double-layered film consisting of 6-1 and 6-2 in FIGS. 13a to 13f of the conventional example) is formed, in which holes are opened. In particular contact hole 7A (the first hole) is formed above one of a pair of $n^+$ region 4 on the opposite sides of word line 3 of a part of memory cell array. In the field area are opened a plurality of holes 7B (the second holes) for forming mask-identifying character-string 8 (digit 12) and a monitor hole 7C (in the monitor pattern area). A monitor contact hole 7D is opened on a suitable area excluding the field oxide film area. Contact holes 7A and 7B are designed to be 0.3 μm×0.3 μm in size, and monitor hole 7C and monitor contact hole 7D are 50 μm×50 μm in size.

As shown in FIGS. 8, 9a, 9b, 9c and 9d, polysilicon film 11 having a thickness of 0.1 μm, followed by Ozone TEOS oxide film 12 having a thickness of 0.6 μm are deposited over the entire surface. Ozone TEOS oxide film is a silicon oxide film produced by reacting TEOS (tetraethoxysilane) and a mixed gas of oxygen and ozone according to atmospheric-pressure CVD and is known to be superior in step coverage. Ozone TEOS oxide film 12 and polysilicon film 11 are etched to form core/bottom electrode layers (12A, 12C/11C, 12D/11D).

In the memory cell area and the character-string 8 area, it is possible to substantially prevent the vertical wall from being formed in the core where formation of a cylindrical electrode is not desired, this being because the sizes of contact holes 7A, 7B are unified to 0.3 μm×0.3 μm, and Ozone TEOS oxide film is used. In the hole 7B area, core is not formed but polysilicon film 11B and zone TEOS oxide film 12B are left because core 12A is formed to have flat surface and no mask against etching. In the monitor hole 7C area and the monitor contact hole 7D area, vertical wall are formed inevitably even if no core is formed. For overcoming the above mentioned problem, core 12C and 12D are 0.5 μm wide and 1.5 μm long (These dimensions are the same as the core in the memory cell area) and are arranged at 0.5 μm intervals to cross over the step of the hole profile. Sidewall layer 11CO and 11DO are formed in the area where neither core 12C nor 12D is formed. Bottom electrode 11C and 11D are formed in the area where cores exist similarly to bottom electrode 11A of the memory cell.

Referring to FIGS. 1, 2 and 3a to 3f, polysilicon film 13 having a thickness of 0.1 μm is deposited by a low pressure CVD technique and etched back by anisotropic plasma etching to form cylindrical electrodes 13A, 13C and 13D. Subsequently the Ozone TEOS oxide film is removed by isotropic etching with a buffered fluoric acid, with interlayer insulating film 6 somewhat etched from the surface. Because no high temperature treatment is used, the Ozone TEOS oxide film can be removed with substantially no fear of the formation of cracks. Thus, a lower electrode is completed as a capacitor electrode of the memory cell. Polysilicon film 11b remains as the support in the character-string 8 area. In the areas of patterns 9 and 10 for monitoring the etch amounts, where the core has existed, the support (bottom electrode) is formed and the vertical sidewall (13CO or 13DO) leaves on the step of the hole. The sidewall is integrated with the proper cylindrical electrode to form a cylindrical structure. On the side of the hole where core has not existed, a doubled sidewall layer consisting of polysilicon films (11CO/13E or 11DO/13F) is formed.

The above mentioned cylindrical structure is adhered to the interlayer insulating film or silicon substrate in a large enough large area to prevent sidewalls 11CO and 11DO from breaking off, otherwise such breaking would occur.

It has been described above that a mask-identifying character-string, a monitor pattern on the field oxide film, and a monitor pattern on the substrate are formed at the same time as the memory cell array.

FIG. 10a to 10d are plans illustrating a process sequence of a second embodiment of the invention, and particularly formation of a monitor pattern for measuring sheet resistance of a lower electrode at the same time as the memory cell array.

Figure 10A:
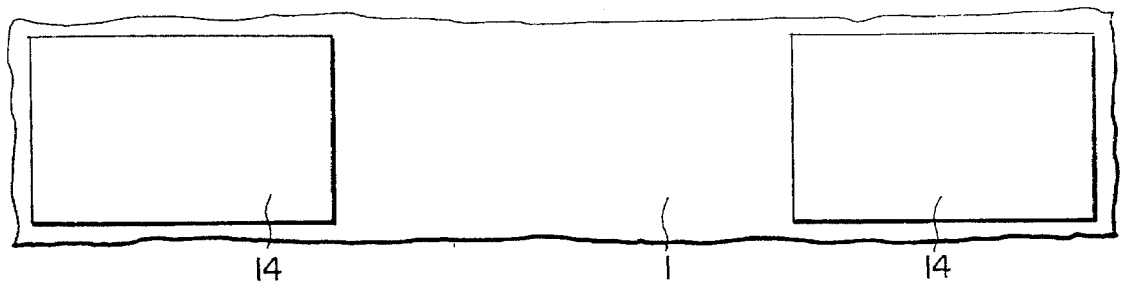
FIGS. 10a to 10d are plan views illustrating process steps in sequence of a second embodiment of the invention.

As shown in FIG. 10a, an n$^+$ region 14 of about 5 μm×10 μm in area is formed simultaneously with n$^+$ region 4 in FIGS. 4 and 5a to 5d.

Figure 10B:
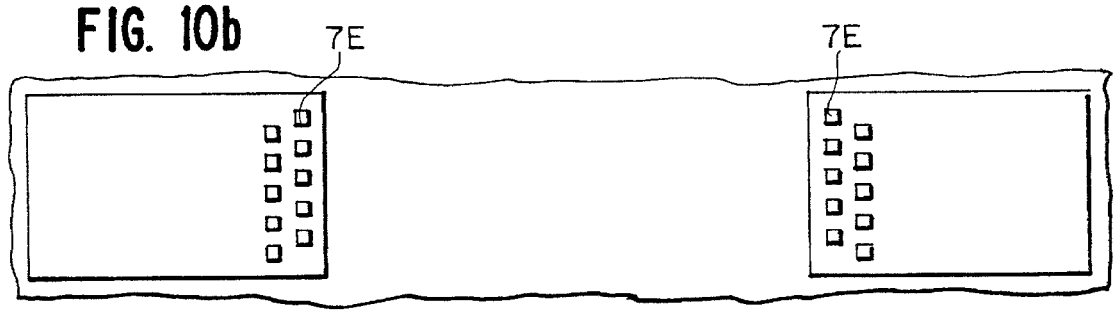

As shown in FIG. 10b, two rows of contact holes 7E of 0.3 μm×0.3 μm in size (the same design as contact hole 7A) are formed in the interlayer insulating film simultaneously with formation of contact holes 7A in FIGS. 6 and 7a to 7d.

Figure 10C:
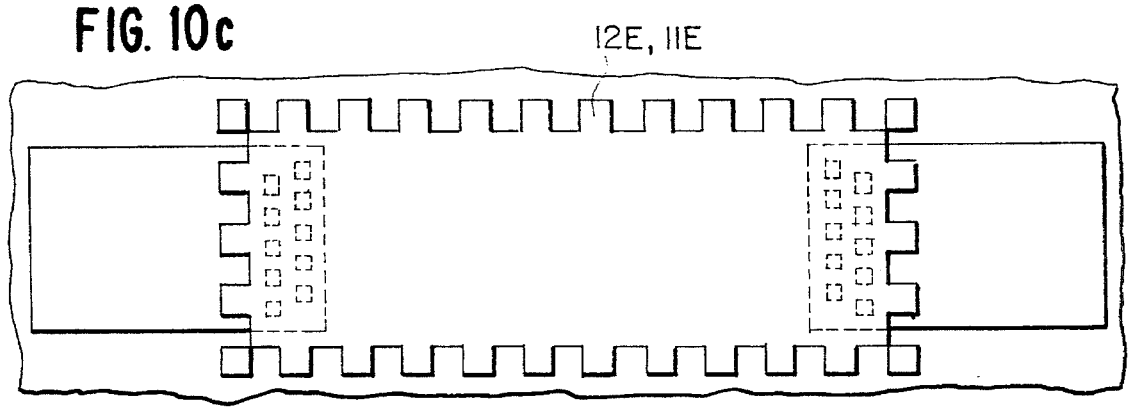
Figure 18A:
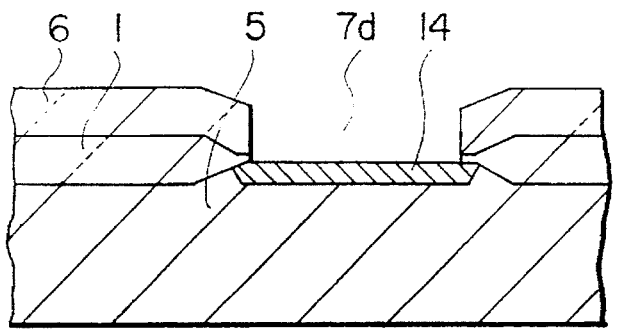
FIGS. 18a, 18b and 18c are cross sections illustrating a process step of conventional example along lines α1-α2 of FIG. 15, β1-β2 of FIG. 14 and γ1-γ2 of FIG. 14, respectively.
Figure 18B:
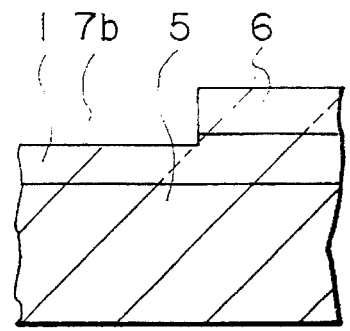
Figure 18C:
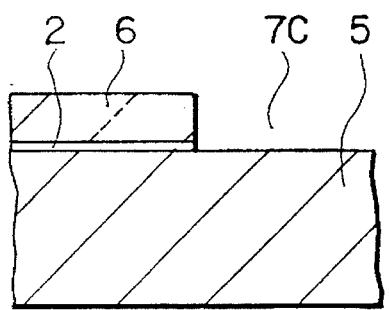
Figure 23:
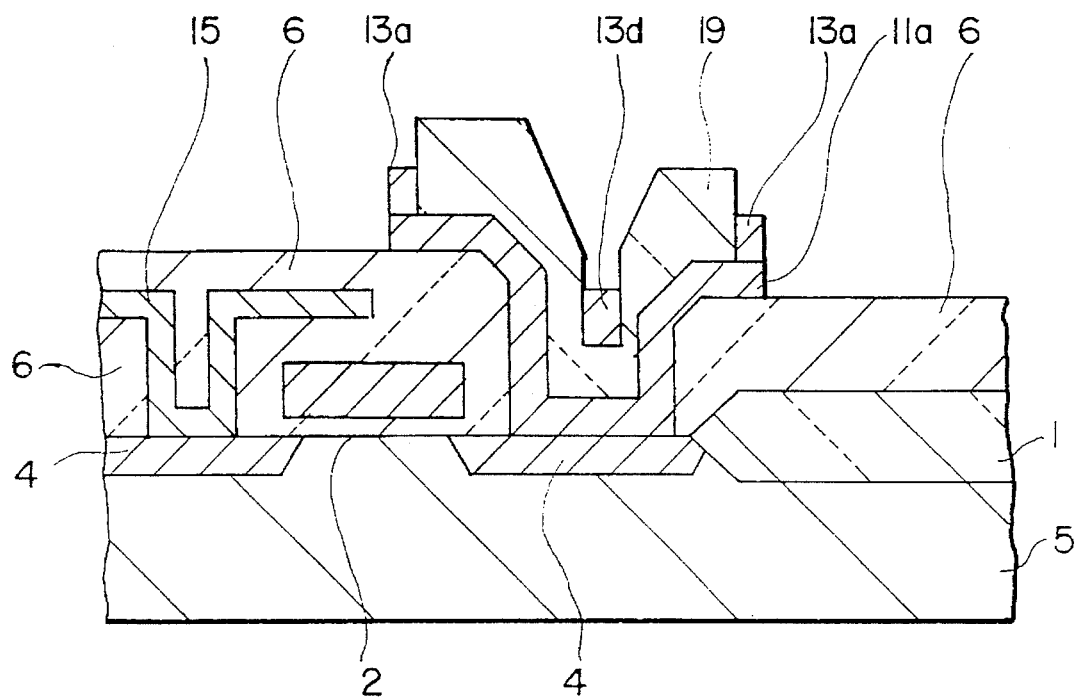
FIG. 23 is a plan view of the memory cell illustrating problems involving the conventional example.
Figure 19A:
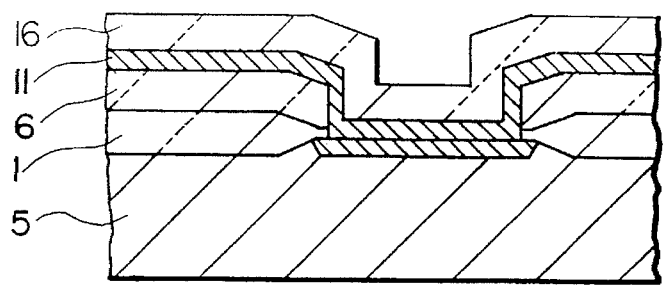
FIGS. 19a, 19b and 19c are cross sections illustrating the next process step of FIGS. 18a, 18b and 18c, respectively.
Figure 19B:
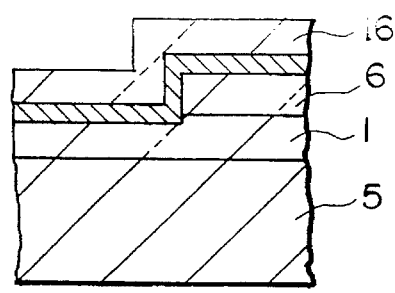
Figure 19C:
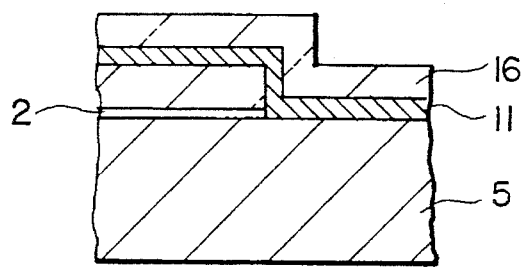
Figure 20A:
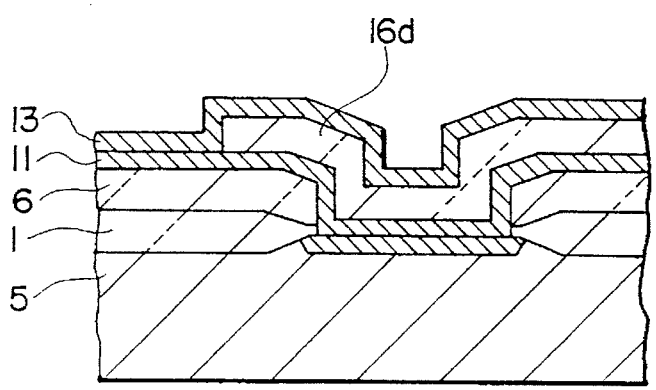
FIGS. 20a, 20b and 20c are cross sections illustrating the next process step of FIGS. 19a, 19b and 19c, respectively.
Figure 20B:
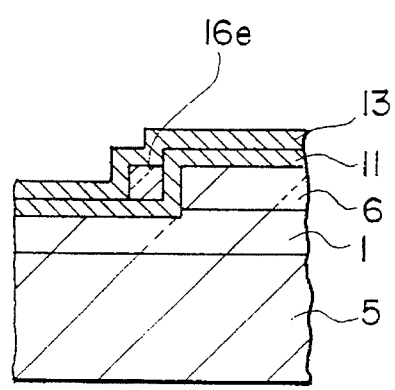
Figure 20C:
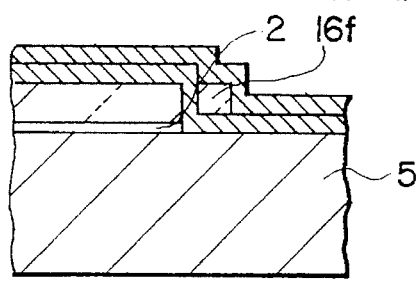
Figure 24:
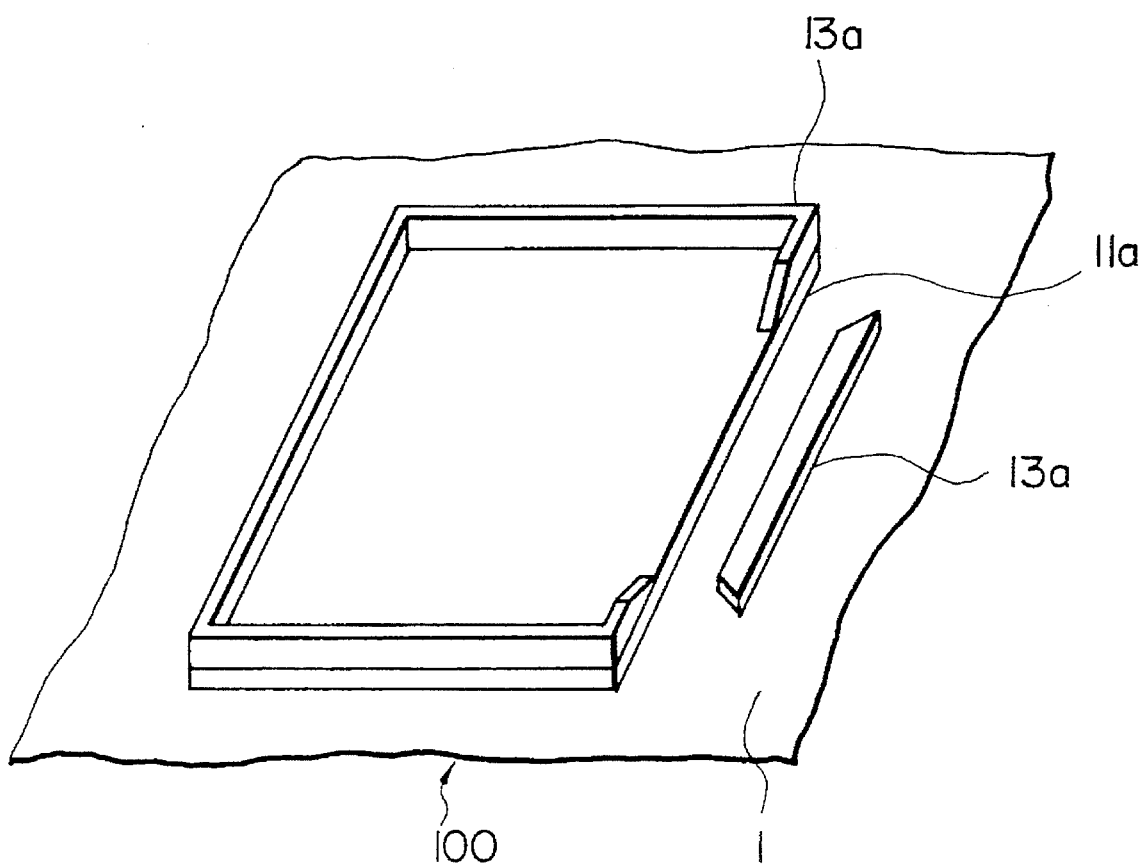
FIG. 24 is a perspective view of cylindrical electrode illustrating other problems involving the conventional example.

As shown in FIG. 10c, core 12E and bottom electrode 11E are formed simultaneously with formation of cores 12A, etc. in FIGS. 8 and 9a to 9d. The edges of core 12E and bottom electrode 11E are not single straight lines, unlike the prior art (FIGS. 18a, 18b and 18c), but toothed by 0.5 to 1.5 μm in both depth and width, substantially the same dimensions as the capacitor electrode of the memory cell.

Figure 10D:
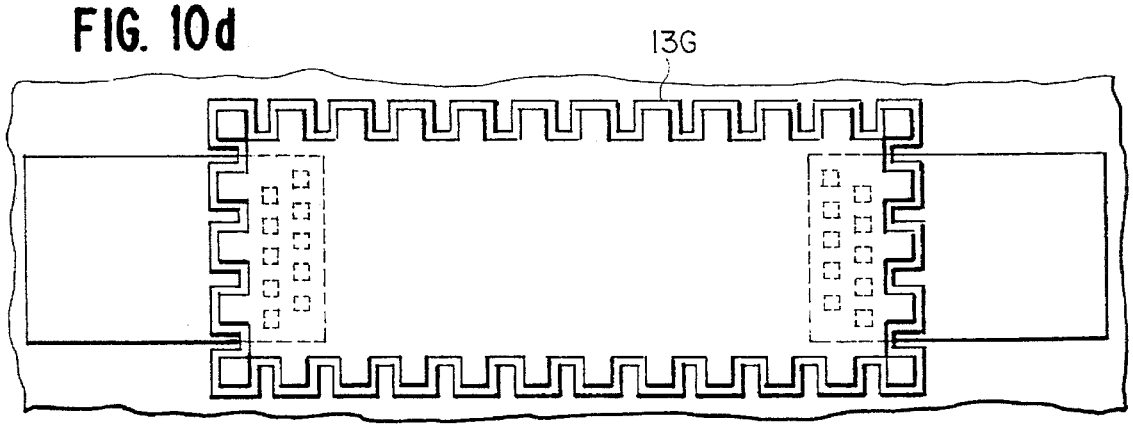
Figure 16:
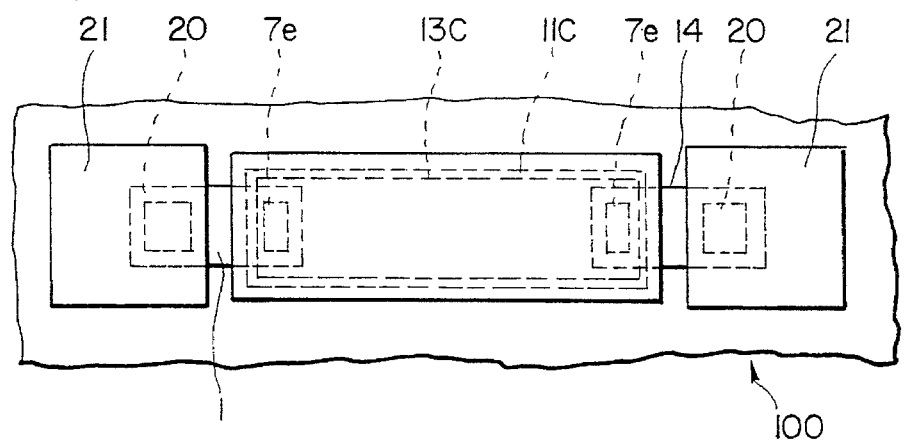
FIG. 16 is a plan view illustrating a TEG for measurement of the sheet resistance of the capacitor electrode in the conventional example.
Figure 17:
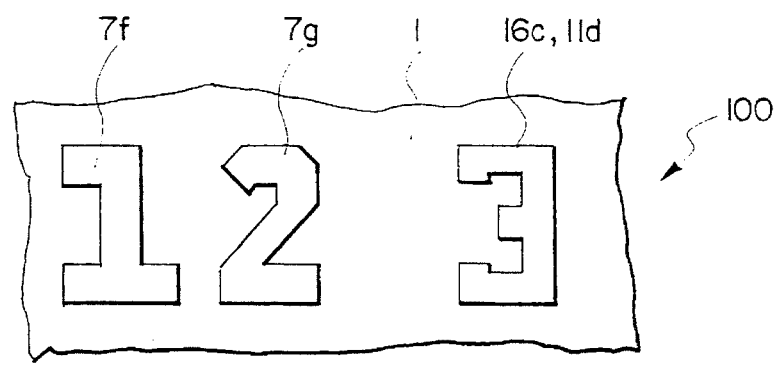
FIG. 17 is a plan view illustrating mask-identifying characters in the conventional example.

As shown in FIG. 10d, cylindrical electrode 13G is formed simultaneously with cylindrical electrode 13A (in FIGS. 1 and 3a to 3f), and the core is removed. The toothed ends minimize occurrence of breakdown as compared with the conventional example of FIG. 16.

Figure 11A:
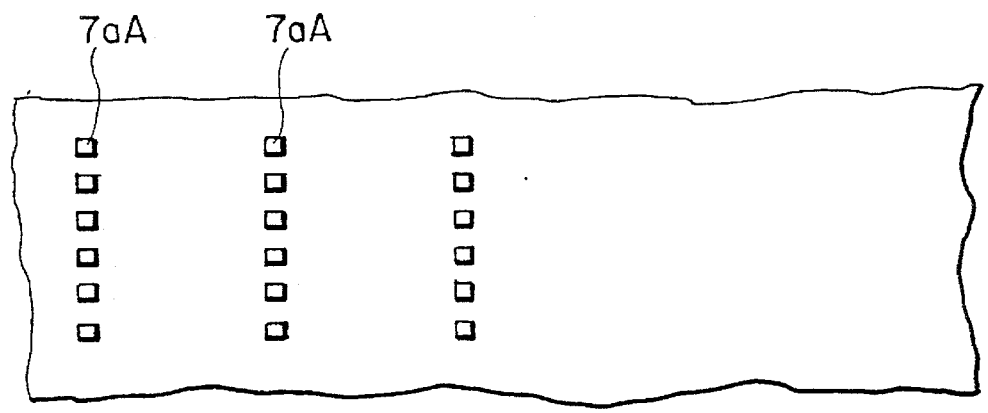
FIGS. 11a to 11c are plan views illustrating process steps in sequence of a third embodiment of the invention.
Figure 11B:
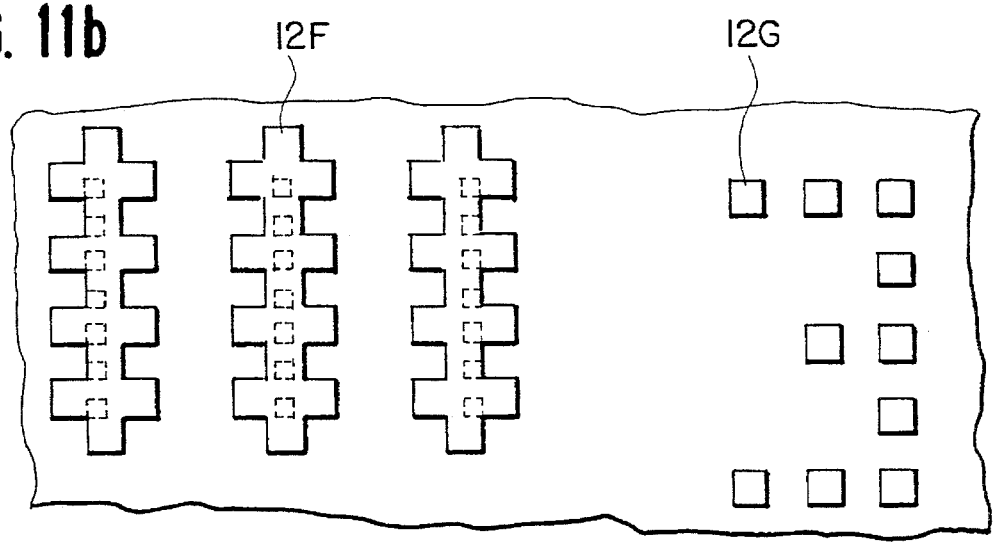
Figure 11C:
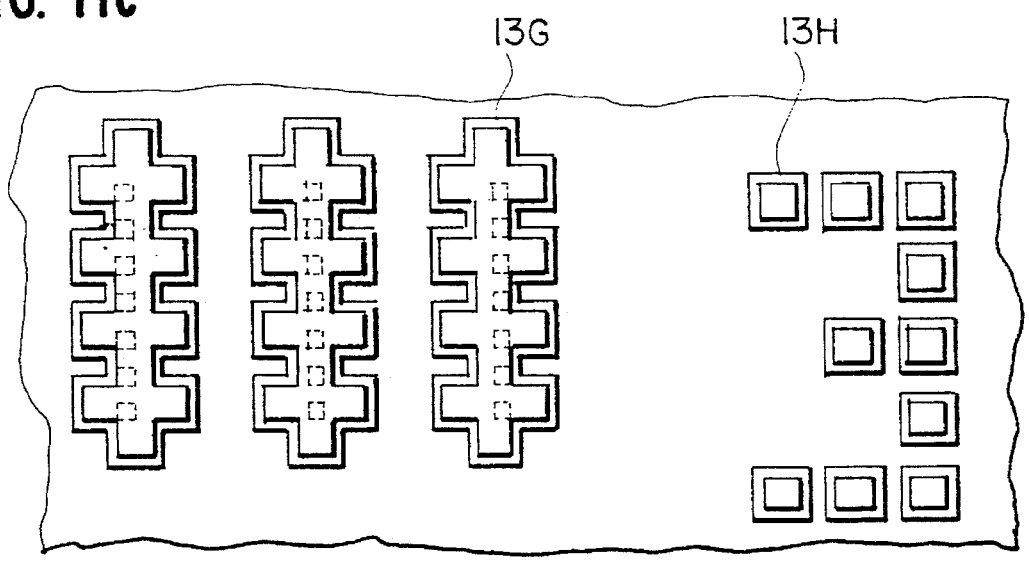

FIGS. 11a to 11c illustrate a process sequence of a third embodiment of the present invention. They illustrate that at the same time as the memory cell array, a vernier pattern (for the naked-eye check, with a microscope, of deviation between the contact hole and the capacitor electrode) and the characters for identifying the mask for the capacitor electrode are formed.

Figure 14:
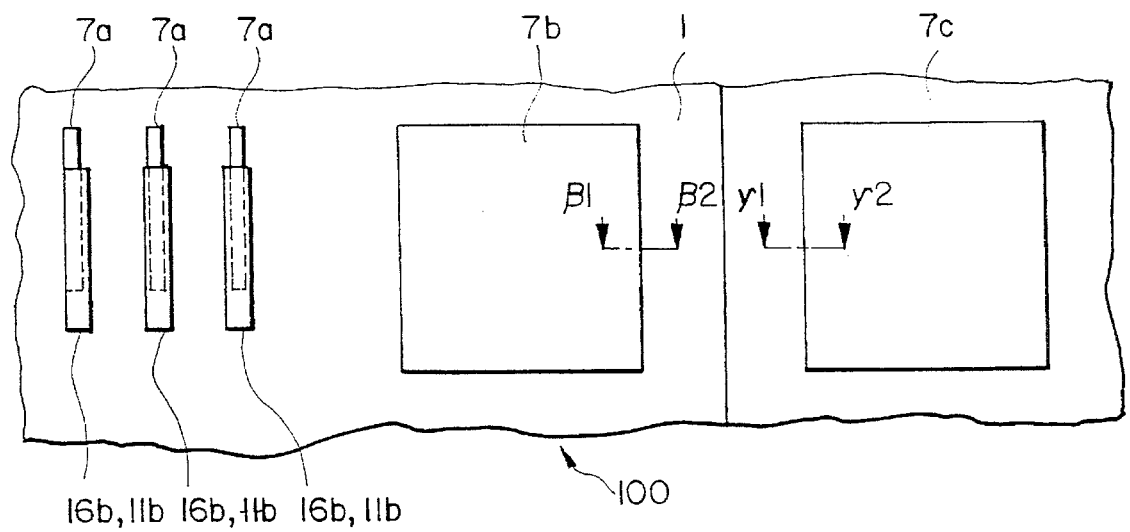
FIG. 14 is a plan view illustrating a vernier pattern, a monitor hole on the field and a monitor contact hole on the substrate in the conventional example.
Figure 13A:
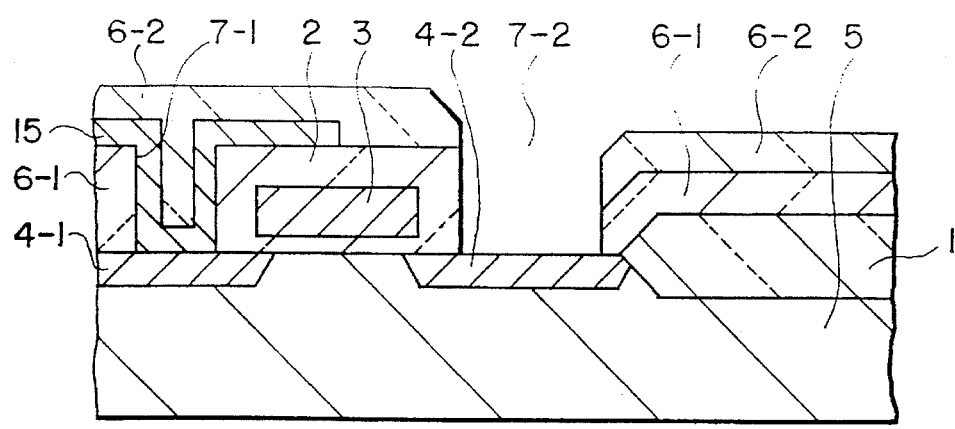
FIGS. 13a to 13f are cross sections illustrating process steps in sequence of a memory cell in a conventional example.
Figure 13B:
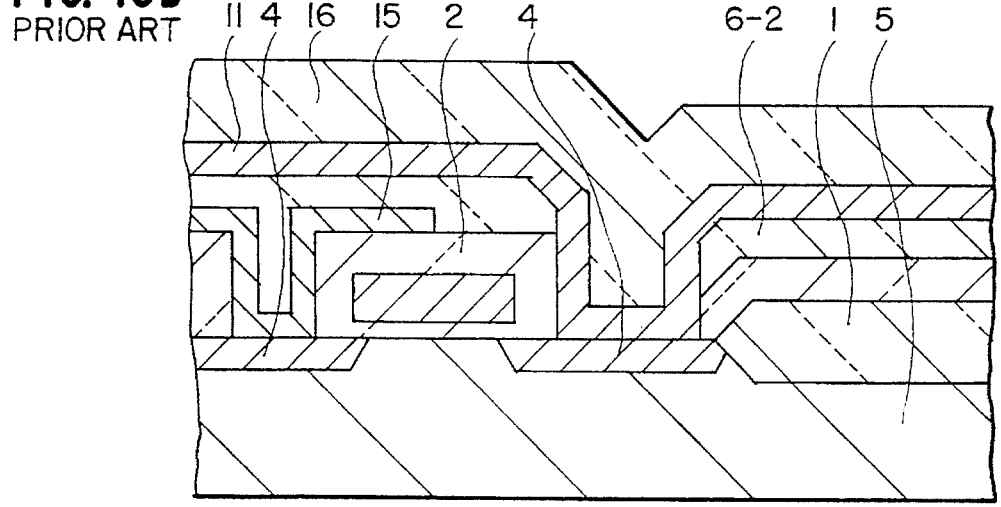
Figure 13C:
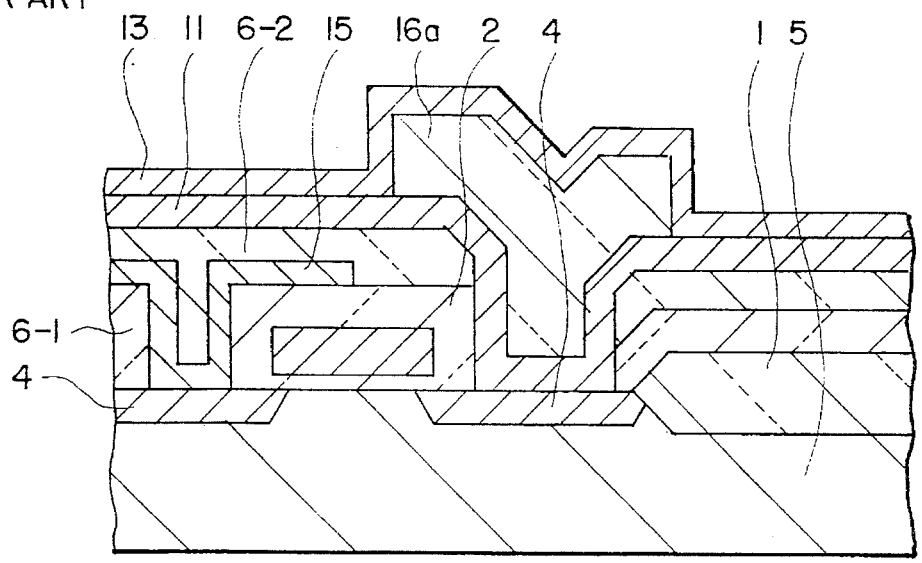
Figure 13D:
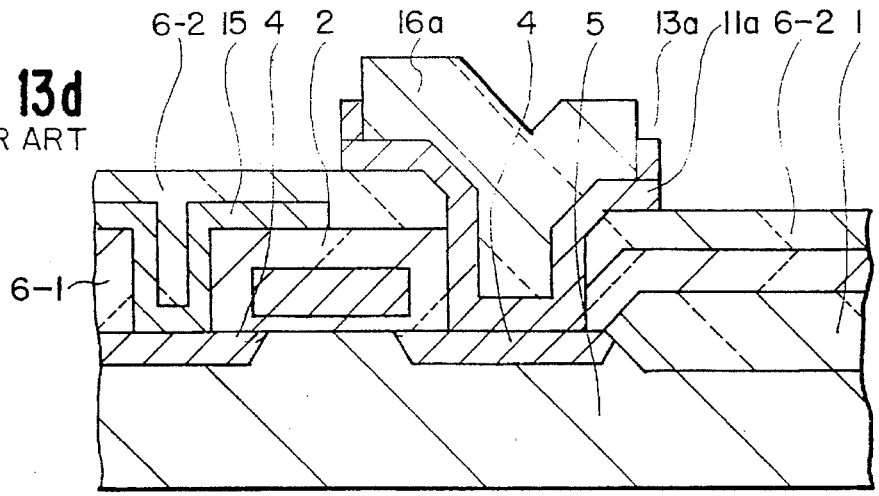
Figure 13E:
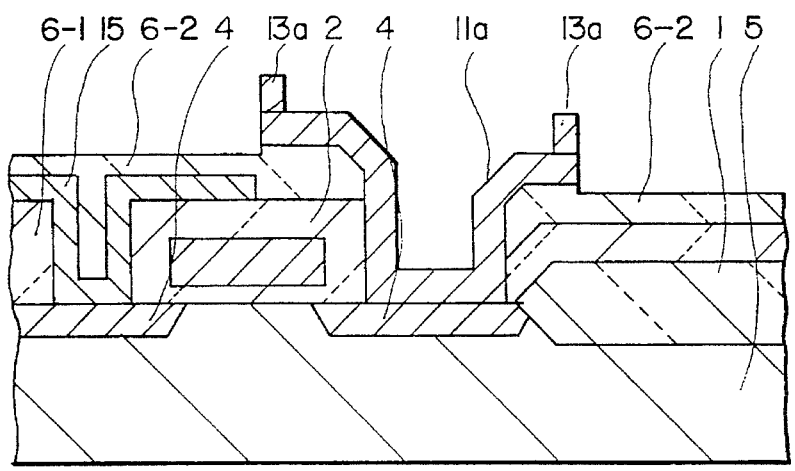
Figure 13F:
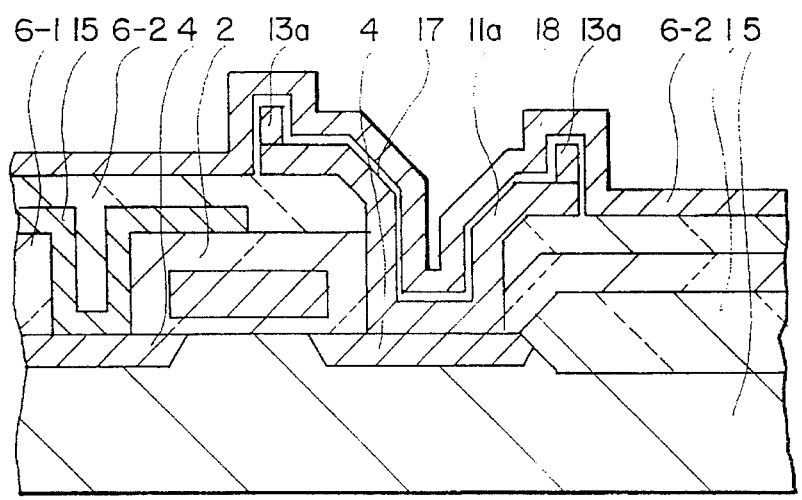

As shown in FIG. 11a, simultaneously with contact holes 7aA, rows of holes 7a of 0.3 μm×0.3 μm in size are opened in the field area. Instead of a rectangular holes 7a in FIG. 14, the rows of holes 7aA are arranged as a main scale pattern.

As shown in FIG. 11b, simultaneously with core 12A, etc. in FIGS. 8 and 9a to 9d are formed cores 12F and 12G under which bottom electrodes of polysilicon film 11 are previously formed. Core 12F, like core 12E (in FIG. 10), is toothed at a regular pitch of 0.5 to 1.5 μm and serves for forming a vernier pattern. Cores 12G which assume a square of 0.5 to 1.5 μm are arranged to represent the digit 3. If cores 12G for representing such a digit or character, are too large, the later-fabricated electrode would break down. For preventing these from being simultaneously unsupported and drifting as a result of the side-etch of the interlayer insulating film associated with the removal of the core oxide film, the size of the smallest part must be at least twice that of the side-etch amount. The side-etch amount, even if the largest, is less than the thinnest portion of the interlayer insulating film, and therefore the size of the smallest part is set to more than twice the interlayer insulating film thickness.

If nearly square as in this example, cores or cylinders are side-etched also from the shorter-edge. To prevent them from floating up, therefore, the shorter edge may be at least twice as long as the side-etch amount or the thinnest part of interlayer insulating film.

As shown in FIG. 11c, simultaneously with formation of cylindrical electrode 13A (in FIGS. 1 and 13a to 13c), cylindrical electrodes 13G and 13H are formed and the cores are removed. Cylindrical electrodes 13G and 13H termed so herein are floating in relation to electric potential. In this embodiment, the vernier pattern consists of toothed loops, and the character pattern consists of "dots". Also the converse is allowed, i.e. that the former consists of dots and the latter consists of toothed loops.

Figure 12A:
FIGS. 12a, 12b and 12c are plan views illustrating the effects of a fourth embodiment of the invention.
Figure 12B:
Figure 12C:
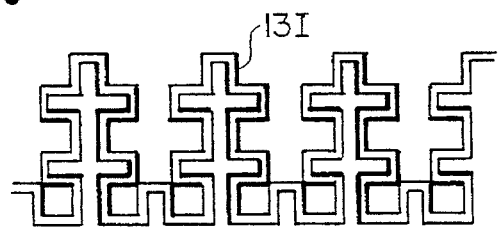
Figure 15:
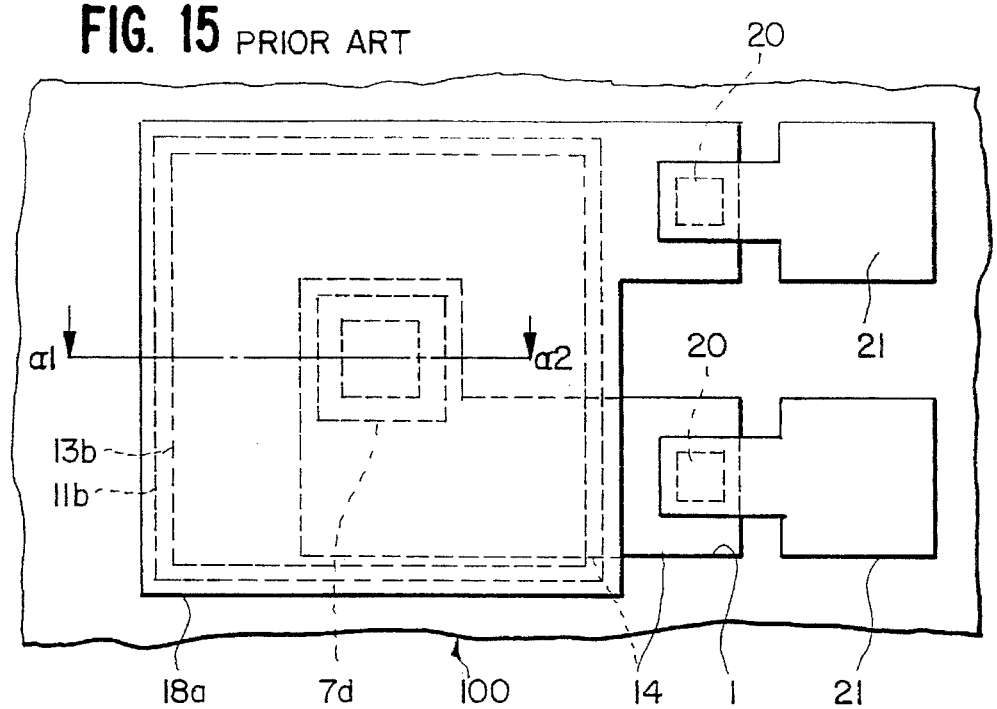
FIG. 15 is a plan view illustrating a TEG of the storage capacitance of in the conventional example.

FIGS. 12a to 12c are plans for illustrating a fourth embodiment of the present invention. Shapes of cylindrical walls (cylindrical electrodes) on the edges of the stack electrodes in the TEG pattern for measuring storage capacitance are similar to those of the conventional example (FIG. 15).

When the pattern has merely long edges as in the conventional example, a cylindrical electrode formed as shown in FIG. 12a along them is not only weak to force in the direction perpendicular to the walls but also has a small area which is in contact with the underlying interlayer insulating film or the polysilicon film as a support. The sheet-resistance measuring pattern of the second embodiment is toothed in the same dimensions as the lower electrode of the memory cell, as shown in FIG. 12. It however is impossible to make both perfectly identical from the respect that even though the sizes are the same, the lower electrode of the memory cell is a closed square, and the tooth has a contour walled in three directions and is open in one direction. Under the circumstances it may happen that the cylindrical electrode of the memory cell is not broken down while the breakdown of the toothed part occurs because of inadequate strength. In this case, while setting the teeth to the same size as the memory cell stack, cylindrical electrode 13, toothed at a small pitch, is formed with the same effect of enhancing the strength against the perpendicular impact to the wall as correspondingly-thicker cylinder wall, leading to minimizing the occurrence of breakdown as mentioned above.

The memory cell with a single contact hole and a rectangular stack electrode is described above. Alternatively, like the sheet-resistance measurement pattern and the vernier pattern, the toothed lower electrode may be connected through a plurality of contact holes to the n$^+$ region.

As described above, the present invention has advantages.

Firstly contact holes or holes have uniform dimensions even if cores, cylindrical electrodes, or the like, are formed in areas other than the memory cell and the cores are made from material having superior step coverage, whereby occurrence of unsupported sidewall layers is prevented. Secondly in the contact holes, etc., is provided the cylindrical structure of the same size as the memory cell which crosses over the step formed along the profile in the interlayer insulating film so that the unintended sidewall layer formed on the step may be firmly secured so as to never come off. Thus, it becomes possible to form monitor patterns for etching, etc. together with the memory cell array on the same chip. Thirdly, all cylindrical electrodes, etc. have substantially uniform dimensions and are toothed at a specified pitch for the prevention of breakdown. Fourthly, the dimensions of the smallest part of the separate cylindrical electrode, etc. is at least twice that of the thickness of the underlying insulating film, or above twice the side-etch amount to prevent the cylindrical electrodes, etc. from being unsupported or coming off, and in turn drifting.

The second through fourth countermeasures can be taken independently of or at the same time with the first. In this way in not only the memory cell itself but also the various patterns needed for control or check for the fabrication process, semiconductor memory devices are obtained without a reduction in reliability and yield.

The invention has thus been shown and described with reference to the specific embodiments. However, it should be noted that the present invention is in no way limited to the details of the embodiments but changes and modifications may be made within the scope of the invention as defined by the appended claims.

What is claimed is:

1. A semiconductor memory device comprising:

a memory cell including a transistor having, as source and drain regions, impurity-diffused regions formed selectively in an active area isolated by field insulating film formed selectively at the surface of a semiconductor substrate and a capacitor comprising a lower electrode including a bottom electrode and a cylindrical electrode, said bottom electrode being formed on an interlayer insulating film formed over the substrate and being connected to one of said impurity-diffused regions through a first hole opened in said interlayer insulating film, said first hole having a first size and a first depth, and said cylindrical electrode being formed at the edge portion of said bottom electrode, a plurality of second holes being formed in said interlayer insulating film on said field insulating film, each of said second holes having a second size and a second depth, said first size being substantially the same as said second size, and said first depth being different from said second depth.

2. The semiconductor memory device of claim 1, wherein said plurality, of second holes form a character.

3. The semiconductor memory device of claim 1, wherein said plurality of second holes constitute an alignment mark.

4. The semiconductor memory device of claim 1, further comprising a monitor means comprising another lower electrode including another bottom electrode and another cylindrical electrode, and the edge of said another bottom electrode and said another cylindrical electrode have a toothed pattern formed thereon at a specified pitch and are looped.

5. A semiconductor memory device comprising:

a memory cell including a transistor having, as source and drain regions, impurity-diffused regions formed selectively in the active area isolated by field insulating film formed selectively at the surface of a semiconductor substrate and a capacitor comprising a lower electrode including a bottom electrode and a cylindrical electrode, said bottom electrode being formed on an interlayer insulating film formed over the substrate and being connected to one of said impurity-diffused regions through a first hole opened in said interlayer insulating film, and said cylindrical electrode being formed at the edge portion of said bottom electrode, a second hole formed in said interlayer insulating film, and having a side surface, said second hole having a size larger than said first hole formed in said interlayer insulating film, a sidewall layer deposited on the side surface of said second hole and formed of the same material as said bottom electrode, and a cylindrical structure formed of the same material as said cylindrical electrode and having a portion formed on said sidewall layer to cross over said sidewall layer.

6. A semiconductor memory device comprising:

a memory cell including a transistor having, as source and drain regions, impurity-diffused regions formed selectively in an active area isolated by field insulating film formed selectively at a surface of a semiconductor substrate and a capacitor comprising a first lower electrode including a bottom electrode and a cylindrical electrode, said bottom electrode being formed on an interlayer insulating film formed over the substrate and being connected to one of said impurity-diffused regions through a first hole opened in said interlayer insulating film, and said cylindrical electrode being formed at the edge portion of said bottom electrode, and an electrically floating second lower electrode including a bottom electrode and a cylindrical electrode, said second lower electrode being in contact with a top surface area of said interlayer insulating film and formed of the same material as said first lower electrode.

7. The semiconductor memory device of claim 6, wherein a lateral size of said top surface area is at least twice as large as the thickness of said interlayer insulating film.

8. The semiconductor memory device of claim 6, wherein a plurality of said electrically floating lower electrodes form a character.

9. The semiconductor memory device of claim 6, wherein said electrically floating lower electrode constitutes an alignment mark.

10. A semiconductor memory device comprising a (1) memory cell including a transistor and a capacitor and (2) an electrically floating lower electrode;

said memory cell being in an active area isolated by field insulating film formed selectively at a surface of a semiconductor substrate;

said transistor having, as source and drain regions, impurity-diffused regions formed selectively in said active area;

said capacitor having a lower electrode including a first bottom electrode portion and a first cylindrical electrode portion; said first bottom electrode portion being formed on an interlayer insulating film on said semiconductor substrate, said first bottom electrode portion being connected to one of said impurity-diffused regions through a hole in said interlayer insulating film, and said first cylindrical electrode portion being formed at an edge of said first bottom electrode portion;

said electrically floating lower electrode including a second bottom electrode portion and a second cylindrical electrode portion; said electrically floating lower electrode being in contact with a top surface of said interlayer insulating film; and said electrically floating lower electrode being formed of the same material as said first lower electrode of said capacitor.

11. The semiconductor memory device of claim 10, wherein:

said interlayer insulating film has a maximum thickness;

said first cylindrical electrode portion of said lower electrode of said capacitor and said second cylindrical electrode portion of said electrically floating lower electrode have respective widths, lengths, and depths; and said respective widths, lengths, and depths of said first and second cylindrical electrode portions all being at least twice as large as said maximum thickness of said interlayer insulating film.

12. The semiconductor memory device of claim 10, wherein a plurality of said electrically floating lower electrodes form a character.

13. The semiconductor memory device of claim 10, wherein said electrically floating lower electrode constitutes an alignment mark.

* * * * *